US011280848B2

(12) United States Patent
Mayer et al.

(10) Patent No.: US 11,280,848 B2
(45) Date of Patent: Mar. 22, 2022

(54) MONITORING DEVICE FOR MONITORING AN ELECTRICAL ENERGY SOURCE WITH RESPECT TO THE SOURCE VOLTAGE THEREOF AND THE INSULATION RESISTANCES THEREOF, HIGH-VOLTAGE SYSTEM, AND METHOD FOR OPERATING THE MONITORING DEVICE

(71) Applicant: LISA DRÄXLMAIER GMBH, Vilsbiburg (DE)

(72) Inventors: Florian Mayer, Seyboldsdorf (DE); Helmut Weiss, Heldenstein (DE)

(73) Assignee: LISA DRÄXLMAIER GMBH, Vilsbiburg (DE)

( * ) Notice: Subject to any disclaimer, the term of this patent is extended or adjusted under 35 U.S.C. 154(b) by 135 days.

(21) Appl. No.: 16/805,280

(22) Filed: Feb. 28, 2020

(65) Prior Publication Data

US 2020/0200833 A1    Jun. 25, 2020

Related U.S. Application Data

(63) Continuation of application No. PCT/EP2018/073250, filed on Aug. 29, 2018.

(30) Foreign Application Priority Data

Aug. 31, 2017    (DE) ..................... 10 2017 119 992.6

(51) Int. Cl.
   *G01R 31/00*     (2006.01)
   *G01R 31/52*     (2020.01)
   (Continued)

(52) U.S. Cl.
   CPC ............. *G01R 31/52* (2020.01); *G01R 27/16* (2013.01); *G01R 31/389* (2019.01)

(58) Field of Classification Search
   USPC .................................... 324/426–435, 761, 1
   See application file for complete search history.

(56) References Cited

U.S. PATENT DOCUMENTS

| 2008/0129308 A1 | 6/2008 | Lindsey et al. |
| 2009/0001993 A1 | 1/2009 | Lindsey et al. |

(Continued)

FOREIGN PATENT DOCUMENTS

| DE | 102006050529 | 4/2008 |
| DE | 102008013436 | 11/2015 |

OTHER PUBLICATIONS

International Search Report for International Application PCT/EP2018/073250, dated Oct. 25, 2018.

*Primary Examiner* — Vincent Q Nguyen
(74) *Attorney, Agent, or Firm* — Burris Law, PLLC (57) ABSTRACT

A monitoring apparatus for monitoring of an electrical energy source features one measuring circuit for each pole of the energy source, which is designed to connect the particular pole via a voltage divider to the reference potential. An evaluating device is provided to detect a particular voltage value at the particular voltage divider and based on the detected voltage values, determines a source voltage datum for the source voltage of the energy source. For at least one of the measuring circuits the total electrical resistance is dependent on a switch state of a particular switching element, and the evaluation device is designed, by switching of the particular switching element, to adjust at least two different switching constellations of the measuring circuits, and based on the voltage values detected for the switching constellations, determines overall resistance data for isolation resistances of the energy source.

15 Claims, 5 Drawing Sheets

(51) Int. Cl.
    *G01R 31/389*     (2019.01)
    *G01R 27/16*     (2006.01)

(56) References Cited

U.S. PATENT DOCUMENTS

| | | |
|---|---|---|
| 2012/0221269 A1 | 8/2012 | Wanner et al. |
| 2013/0257463 A1 | 10/2013 | Peuser |
| 2013/0300430 A1 | 11/2013 | Lindsay et al. |
| 2014/0159908 A1 | 6/2014 | Hong et al. |
| 2015/0168497 A1 | 6/2015 | Tabatowski-Bush |
| 2015/0185272 A1* | 7/2015 | Oberzaucher .......... G01R 31/12 324/761.01 |
| 2015/0276846 A1 | 10/2015 | Paris et al. |
| 2017/0045562 A1* | 2/2017 | Gleiter ................. G01R 15/06 |
| 2018/0074113 A1* | 3/2018 | Sung ................. G01R 31/1227 |

* cited by examiner

MONITORING DEVICE FOR MONITORING AN ELECTRICAL ENERGY SOURCE WITH RESPECT TO THE SOURCE VOLTAGE THEREOF AND THE INSULATION RESISTANCES THEREOF, HIGH-VOLTAGE SYSTEM, AND METHOD FOR OPERATING THE MONITORING DEVICE

CROSS-REFERENCE TO RELATED APPLICATIONS

This application is a continuation of International Application No. PCT/EP2018/073250, filed on Aug. 29, 2018, which claims priority to and the benefit of DE 10 2017 119 992.6, filed on Aug. 31, 2017. The disclosures of the above applications are incorporated herein by reference.

FIELD

The present disclosure relates to a monitoring apparatus for monitoring an electrical energy source with respect to its source voltage and its isolation resistances. The energy source is in particular a direct voltage source. It can be, for example, a high-voltage battery of an electric vehicle. Accordingly, the present disclosure also pertains to a high-voltage system with the electrical energy source and the monitoring apparatus. Further, the present disclosure also relates to a method for operating of the monitoring apparatus.

BACKGROUND

The statements in this section merely provide background information related to the present disclosure and may not constitute prior art.

An electrical high-voltage circuit in an electrical high-voltage system can be kept electrically isolated with respect to a reference potential. The electric lines and components of the high-voltage circuit can be electrically separated from the reference potential by means of the insulating material and/or via air gaps to ensure this electrical isolation. The electrical isolation herein is acting with respect to the positive (plus) pole and also with respect to the negative (minus) pole of the energy source, so that two relevant isolation resistances are obtained. One such high-voltage system can be provided, for example, in an electric vehicle. In this kind of vehicle high-voltage system, the electrical energy source of the high-voltage circuit can be provided by a high-voltage battery. The stated reference potential can be a ground potential, such as the terminal potential KL31 known, for example, in an electric vehicle.

In the case of an electrical high-voltage system it may be desirable to use a monitoring apparatus, which is not itself a constituent of the electrical high-voltage circuit, but which is instead operated at the reference potential, to monitor the source voltage between the poles of the energy source (positive pole and negative pole) and also the isolation resistances acting between each one of the poles of the energy source and the reference potential; this may be important, for example, to detect the charge state of the energy source and to detect any wear or damage to the electrical isolation. Measuring circuits can be used for this purpose.

One such monitoring apparatus for monitoring of a high-voltage battery is known from DE 10 2006 050 529 A1. Two measuring circuits with voltage dividers are provided for measuring of the battery voltage with respect to a ground potential. Two additional measuring circuits are provided for measuring of isolation resistances.

Thus the solution known from the prior art provides that one independent measuring circuit is provided for each pole for the determination of the source voltage firstly, and for determination of the isolation resistances secondly. The complexity of the circuitry is accordingly great. In addition, it is necessary to minimize the bias current of the energy source with switched-off electrical high-voltage circuit, thus for example, with the electric vehicle switched off. Thus no bias current may be allowed to flow from the energy source through one of the measuring circuits. In this case every measuring circuit must be galvanically isolated from the energy source by means of a separate mechanical circuit breaker. Thus for each measuring circuit there is an associated mechanical circuit breaker, which can further increase the component complexity for a monitoring apparatus.

Document DE 10 2008 013 436 B4 describes the determination of isolation resistances of an electrical isolation of a stack of fuel cells by means of a single, switchable measuring circuit by adjusting of two switching constellations. The two switching constellations are adjusted firstly by switching a test resistance in parallel to one of the isolation resistors, and then again disconnected from the isolation resistor.

SUMMARY

This section provides a general summary of the disclosure and is not a comprehensive disclosure of its full scope or all of its features.

The present disclosure provides an economical monitoring apparatus for monitoring of an electrical energy supply of an electrical circuit isolated with respect to a reference potential, in particular for monitoring a high-voltage circuit.

As used herein, the term "high-voltage" in the case of an electrical direct voltage means an electrical voltage with a value greater than about 60 V and less than about 1.5 kV. In the case of an electrical alternating voltage, the term "high-voltage" means an electric voltage with a value greater than about 30 V rms (root mean square) and less than about 1 kV rms.

The present disclosure provides a monitoring apparatus which is designed to monitor or to test an electrical energy source with respect to a source voltage which the energy source produces between two electrical poles, and with respect to one particular isolation resistance acting between one of the poles and a predetermined reference potential. The particular isolation resistance between one of the poles and the reference potential is obtained by means of an electrical isolation which can be formed by means of at least one insulating material and/or an air gap. The reference potential can pertain to a ground potential, compared to which the electrical energy source is to be electrically separated or isolated by means of the electrical isolation.

The monitoring apparatus features a separate measuring circuit for monitoring of each of the two poles. In other words, both a first pole which is designated hereinafter as the positive pole, is connected to the reference potential via one of the measuring circuits. In addition, a second pole of the energy source, which is designated hereinafter as the negative pole, is connected to the reference potential via a second measuring circuit. Each of the measuring circuits is designed to connect the particular pole to the reference potential by means of a voltage divider of the measuring circuit. A voltage divider in this regard is a series circuit of two circuit branches and between them a measured voltage can be picked off at a pick-off point. An evaluation device of the monitoring apparatus is provided to detect a particular voltage value at the particular voltage divider of the measuring circuits, that is, at the particular pick-off point. Thus we are dealing with the value of the stated, particular measured voltage. The evaluation device is furthermore designed to determine a source voltage datum of the source voltage based on the detected voltage values. In other words, the evaluation device is designed to draw a conclusion about the source voltage from the voltage values. The source voltage datum herein can be, for example, a voltage value of the source voltage. But in one simplified form, the source voltage datum can be merely "in order" or "not in order," for example, or an equivalent datum, thus in general a status datum of the source voltage and/or of the energy source.

Thus two measuring circuits can be provided for determining of the source voltage datum of the source voltage. Now in order not to involve two additional measuring circuits to determine isolation resistances, according to the present disclosure, the total electrical resistance of at least one of the two measuring circuits is adjustable or variable. The total resistance is that electrical resistance between the particular pole to which the measuring circuit is connected or circuited, and the reference potential. In the case of one of the measuring circuits or of both of the measuring circuits, their particular total resistance is dependent on a switch state of the particular switching element of the measuring circuit. The particular switching element can be designed to switch between an electrically conducting state and an electrically blocked state, depending on a switching signal. The switching signal can be generated by the evaluation device. The evaluation device is thus designed accordingly to adjust at least two predetermined, different switching constellations of the measuring circuits by switching of the particular switching element. So with each individual switching element, two switching constellations can be adjusted within the particular measuring circuit, namely "switching element electrically conducting" and "switching element electrically blocked." If each of the two measuring circuits features a switching element, then there results a total of four possible switching constellations of the measuring circuits, namely two per measuring circuit. But in the case of only one switching element, a total of only two switching constellations is possible.

The evaluation device is furthermore designed, based on the particular voltage values of the voltage dividers detected for each of the switching constellations, to determine a particular resistance datum for the two isolation resistances by means of a predetermined allocation guideline. Thus a determination is made firstly of the resistance datum for the isolation resistance between the positive pole and the reference potential, and secondly of a resistance datum for the isolation resistance between the negative pole and the reference potential. The resistance datum can thus denote a resistance value, for example. But in a simplified form, the resistance datum can also include a status datum, such as for example, "in order" and "not in order," or stand for an equivalent statement. Thus the allocation guideline assigns the total voltage values of the voltage dividers measured or detected for all adjusted switching constellations to a total of two resistance data, namely one per isolation resistance. The allocation guideline can be implemented, for example, by a characteristic field or by a table. As will be explained below, the allocation guideline can also be a calculation guideline.

The advantage provided by the present disclosure is that a total of only two measuring circuits, each with one voltage divider are used in order to monitor both the source voltage as well as the two isolation resistances of the electrical energy source, or to determine a particular status datum and/or a value for the source voltage and the two isolation resistances. The evaluation device used for this can be constructed on the basis of a microcontroller or microprocessor, for example, which can be operated at the reference potential and thus need not be designed for the source voltage, that is, for a high voltage source, for instance. For detecting of the voltage values, the evaluation device can feature at least one analog-digital converter, for example, whose particular analog input can be connected to one of the voltage dividers or can be circuited between the voltage dividers. The monitoring apparatus is intended in particular for an electrical high-voltage system for a motor vehicle.

Additional forms of the present disclosure are described below which will elucidate some additional advantages.

According to one form, both measuring circuits each feature one circuit element of the described kind. As was described, a total of four switching constellations is thus possible. The evaluation device is designed to adjust at least three predetermined, different switching constellations of the measuring circuits by switching of the particular switching element. Furthermore, the evaluation device is designed, based on the particular voltage values of the voltage dividers detected for each of the switching constellations, to determine a particular resistance datum for the two isolation resistances by means of an allocation guideline (thus on the basis of the voltage values of all the adjusted switching constellations). This yields the advantage that in the case of an unfavorable resistance relationship of one of the isolation resistances to the total resistance of one of the measuring circuits, the other particular measuring circuit can be used for determining of the resistance datum for this isolation resistance. A predetermined, unfavorable resistance relationship is obtained, in particular, when the isolation resistance with respect to the total resistance of one of the measuring circuits is small enough such that the resulting numerical relationships reside in the range of the measuring accuracy of the evaluation device and/or of the calculating accuracy of the evaluation circuit. This may be the case, for example, when the total resistance of one of the measuring circuits amounts to 1 mega-ohm and an isolation resistance has fallen to a value of less than 10 kilo-ohms.

One form provides that one such switching element is provided in the at least one measuring circuit for switching of the total resistance and comprises at least one semiconductor switch. A semiconductor switch of this kind can be, for example, one based on a transistor, in particular a field effect transistor, such as a MOSFET (metal oxide semiconductor field effect transistor). A semiconductor switch has the advantage that switching is possible without any wear. In comparison to a mechanical switch, this will improve the lifespan of the measuring circuit.

One form provides that for each measuring circuit, additionally one mechanical circuit breaker is provided which is designed to connect or to couple the measuring circuit to one of the poles of the energy source. Furthermore, the circuit breaker is designed to switch between an electrically connected state and an electrically disconnected state, depending on a coupling signal from the analysis device. Thus the evaluation device can specifically connect each measuring circuit electrically or galvanically to one of the poles of the energy source due to the generation of the particular coupling signal. In addition, by means of the circuit breaker each measuring circuit can be galvanically disconnected from the energy source, so that a bias current on each measuring circuit can be reduced to zero. Thus overall only two mechanical circuit breakers are used for the monitoring apparatus, since only the two measuring circuits have to be galvanically separated from the energy source. A mechanical circuit breaker can be designed on the basis of a relay or electric contactor.

One form of the present disclosure provides that each of the circuit breakers comprises a reed relay or is designed as a reed relay. In this respect the obtained advantage is that a galvanic disconnect from the energy source is also assured for the coupling signals of the analysis device.

One form provides that the evaluation device is designed to keep each of the circuit breakers in the electrically connected state, or closed, for all adjusted switching constellations of the measuring circuits by means of the particular coupling signal. In other words, the switching between the switching constellations takes place independently of the circuit breakers which can be kept in the electrically connected state during this time, that is, closed. Switching between the switching constellations thus does not involve any mechanical switching of the circuit breakers. Thus the monitoring process or measuring process can be conducted in a non-wearing manner.

One form provides that the stated allocation guideline is based on a calculation guideline, which overall relates the voltage values detected at the voltage dividers to the isolation resistances. As was already explained, the allocation guideline can be implemented alternatively as a characteristic field or table. It will be explained below in connection with the figures how to form a calculation guideline in the discussion of the exemplary forms.

Additional forms relate to the question of how the total resistance of the measuring circuit changes or can be adjusted by means of the particular switching element of a measuring circuit.

One form of the present disclosure provides that for one or for each of the two measuring circuits, one bridging branch is circuited in parallel to the voltage divider of the measuring circuit, and this bridging branch features an electrical resistance element, that is, a component with an ohmic resistance, and also the switching element of the measuring circuit. The switching element in the bridging branch herein is inlet connected or outlet connected to the resistance element. A bridging branch has the advantage that it can be inserted into or supplemented into a measuring circuit with its already present voltage divider with very little engineering effort.

One form provides that in the particular bridging branch an additional resistance element is circuited in parallel to the switching element. This additional resistance element can also act as a protective resistor when the switching element is in the electrically blocking state. Because due to the additional resistance element, the electric voltage now decreasing across the switching element can be limited. Thus an electric breakthrough in the switching element can be inhibited.

One form provides a supplement to or an alternative to the stated bridging branch. This form proceeds from the known design of a voltage divider, that is, the voltage divider is designed in the manner already described as two circuit branches which are connected via a pick-off point where the voltage value of the voltage divider can be picked off. In one or both of the measuring circuits here, the switching element is designed in the electrically conducting state to bridge electrically, at least in part, at least one of the two circuit branches of the voltage divider. Thus in this manner the electrical resistance in the particular circuit branch is changed. Since the bridging is only partial, a residual resistance on the circuit branch remains, so that the function of the voltage divider continues in place. The bridging occurring within the voltage divider provides the advantage that no additional bridging branch is used.

One form of the present disclosure provides that the evaluation device is galvanically connected to the reference potential. The evaluation device thus features no freely oscillating potential with respect to the reference potential, which would otherwise necessitate a complicated, galvanically decoupled data transmission, for example, to a communication bus.

As explained above, the monitoring apparatus is used, in one form, in an electric system with a high-voltage energy source. Accordingly, the present disclosure also relates to one such high-voltage system with an electrical energy source, which then generates a source voltage in the related manner between its two electrical poles, and which specifically is a high voltage. Furthermore, the high-voltage system features an electric switching network. For example, in this case the present disclosure provides for a combination of an intermediate circuit and at least one electric consumer and/or a combination with a charging connector. An intermediate circuit can have, for example, an intermediate circuit capacitor for buffering of electric energy. The at least one electric consumer can be designed, for example, as an electric machine with its inverter. A charging connection can be configured to connect a charging device or a charging station for charging of the energy source. Each pole of the energy source is connected to the switching network via a separate safety switch. Each safety switch is designed and intended to galvanically connect and to disconnect the particular pole to/from the switching network, that is for example, as a function of a control signal. In other words, the safety switch is designed for galvanic disconnect switching. A safety switch of this kind can be produced from an electric contactor, for example.

In the high-voltage system according to the present disclosure, a point of connection is provided between the particular pole of the energy source and the particular safety switch belonging to this pole. In addition, one form of the monitoring apparatus according to the present disclosure is provided wherein each of the measuring circuits of the monitoring apparatus is connected or coupled to each one of the connection points. In other words, each measuring circuit is connected between the pole and the associated safety switch which leads to the switching network. Thus the energy source can also be monitored when the safety switches are opened, that is, when they are galvanically disconnected.

According to one form, the energy source comprises a high-voltage battery and/or a stack of fuel cells. In other words, the high-voltage system can be a mobile high-voltage system, like that used in an electric vehicle, for instance, thus meaning a motor vehicle with electric drive or hybrid drive.

According to one form the voltage source is a direct voltage and a voltage value of the source voltage is greater than about 60 V and less than about 1500 V. In the high-voltage system according to the present disclosure, a high voltage of this kind can be kept separated galvanically from a reference potential, for example a ground potential, and yet still be monitored by an evaluation device which is operated at ground potential. But the energy source can also be an alternating voltage source with an alternating voltage whose voltage value is greater than about 30 V rms and less than about 1000 V rms, according to one form.

Due to the operation of the monitoring apparatus, the method for monitoring of an electrical energy source is obtained. Thus the monitoring apparatus connects each of two poles of the energy source to a reference potential via a voltage divider of a particular measuring circuit, and an evaluation device then detects a particular voltage value at the particular voltage divider of the measuring circuits. Based on the detected voltage values the evaluation device determines a source voltage datum of the source voltage.

Furthermore, for at least one of the measuring circuits a particular total electric resistance is adjusted or switched by the evaluation device by means of a switching element of the particular measuring circuit. The evaluation device thus is designed to adjust at least two predetermined, different switching constellations by switching of the particular switching element. Based on the particular voltage values of the voltage dividers for each of the switching constellations, the evaluation determines a particular resistance datum for the two isolation resistances by means of a predetermined allocation guideline. The discussion above regarding the monitoring apparatus applies accordingly also to the source voltage datum and the resistance data.

The present disclosure also relates to refinements of the method having features which have already been described above in connection with the refinements of the monitoring apparatus. For this reason, the corresponding refinements of the method according to the present disclosure will not be described here again.

Additional features of the present disclosure are indicated in the claims, the figures and the description of the figures. The features and combinations of features named in the description and also the features and combinations of features indicated below in the description of figures and/or in the figures themselves can be used not only in the combination cited, but also in other combinations or as individual features.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

In the figures, the same reference symbols indicate that the particular referenced elements are functionally the same.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Figure 1:
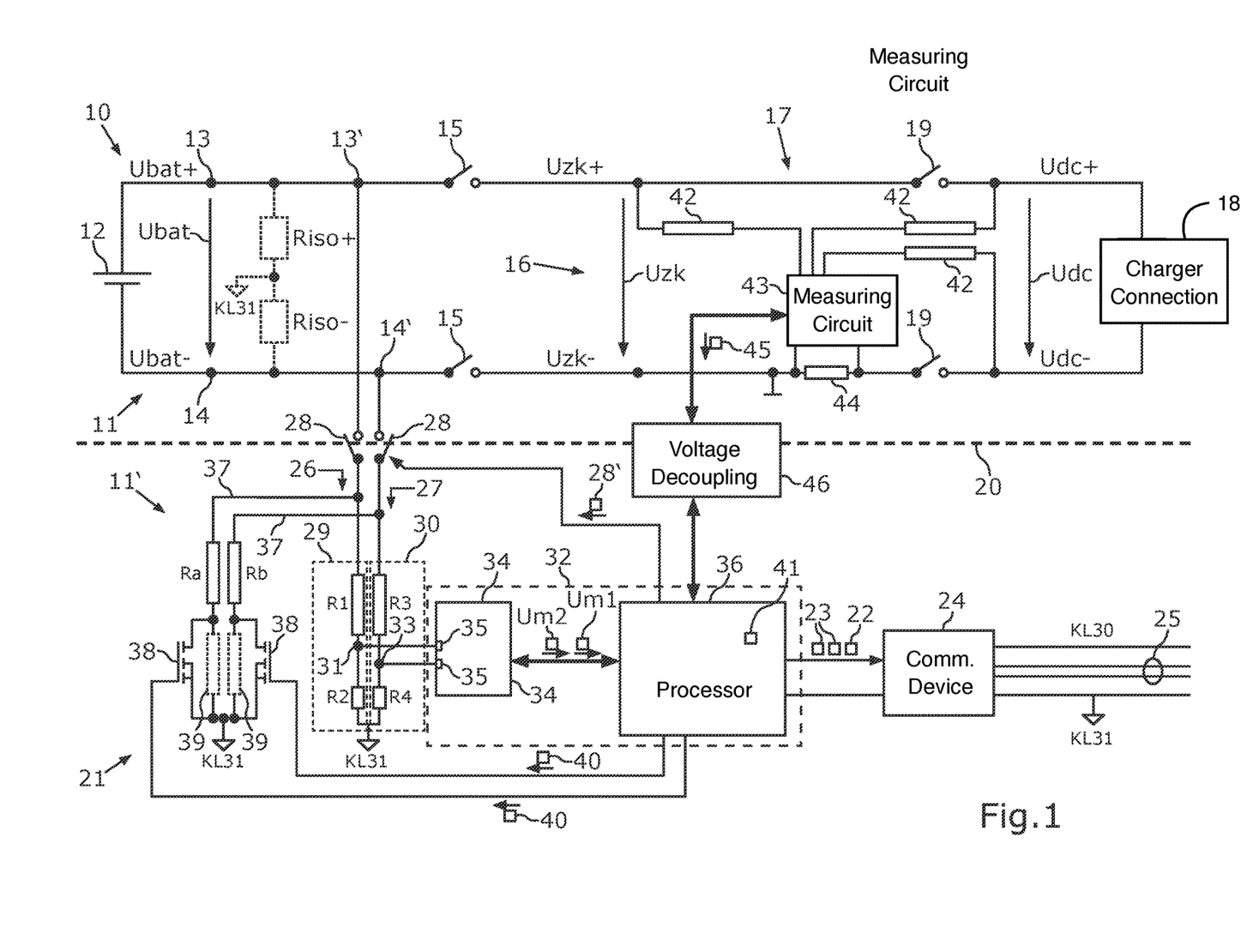
FIG. 1 is a schematic representation of one form of the high-voltage system according to the present disclosure.

FIG. 1 depicts a high-voltage system 10 which can be equipped with a high-voltage circuit 11 and a low-voltage circuit 11'. The high-voltage system 10 can be installed in an electric vehicle, for example. For example, this could refer to a constituent of an electric propulsion device of an electric vehicle.

In the high-voltage circuit 11, an electrical energy source 12 can be, for example, a high-voltage battery generating a source voltage Ubat between a first pole 13 (positive pole) and a second pole 14 (negative pole), which has a high voltage greater than 60 V, in particular greater than 100 V. This kind of electric potential of the poles 13, 14 with respect to a reference potential KL31 of the low-voltage circuit 11' is designated in FIG. 1 as Ubat+ for the pole 13 and as Ubat− for the pole 14. The source voltage Ubat represents the potential difference between the potentials Ubat+ and Ubat−. The reference potential KL31 can be a ground potential of the low-voltage circuit 11'. The designation of the reference potential KL31 corresponds to the designation "terminal 31" for the ground potential in a motor vehicle. Alternatively, the reference potential KL31 measured against a vehicle chassis of the motor vehicle can also be used.

In a high-voltage circuit 11 the poles 13, 14 of the energy source 12 can be circuited across a particular safety switch 15 with a circuit network 16. Each safety switch 15 can comprise an electric contactor, for example. The circuit network 16 can comprise, for example, an intermediate circuit 17 and an electric charger connection 18 connected thereto. The intermediate circuit 17 includes an electric capacitor (not illustrated), for example, for buffering of energy from the energy source 12 and/or for buffering of electric energy supplied from the charger connection 18. The circuit network 16 can be designed, for example, for connecting of a charging plug of a charging station. The electric potentials of the intermediate circuit 17 with respect to the reference potential KL31 are denoted in FIG. 1 as Uzk+ and Uzk−. The intermediate circuit 17 can be circuited via additional switches 19 with the charger connection 18 whose electric potentials with respect to the reference potential KL31 are denoted as Udc+ and Udc− at the two switches 19. The switches 19 are closed only for charging. Each switch 19 can be designed as an electric contactor.

A low voltage KL30 can be supplied in the low-voltage circuit 11' to power electrical consumers. The low voltage KL30 can be present in a range from 6 V to 60 V. It can be, for example, a 12 V supply voltage. The low voltage KL30 having the designation "terminal 30" corresponds to the ignition voltage in a motor vehicle.

A galvanic separation 20 should be provided between the high-voltage circuit 11 and the low-voltage circuit 11'; this separation is represented symbolically in FIG. 1 as a separating line. In other words, the electric circuit of the high-voltage circuit 11 should be inherently closed, without leading to or flowing through the reference potential KL31. In this respect the energy source 12 in particular is electrically isolated from the reference potential KL31 by means of an electric insulation. This electric insulation acts between the pole 13 and the reference potential KL31 as an isolation resistance Riso+ and between the pole 14 and the reference potential KL31 as an isolation resistance Riso−. The isolation resistances Riso+ and Riso− are represented symbolically in FIG. 1 as resistance elements.

The status of both the source voltage Ubat and also of the isolation resistances can be monitored from the low-voltage circuit 11'. For this purpose, from the low-voltage circuit 11' a monitoring apparatus 21 for the source voltage Ubat can produce a source voltage datum 22, and for each of the isolation resistances Riso+, Riso− it can produce one resistance datum 23 each, which can be supplied, for example via a communications device 24, into a communications medium 25, for example, into a communications bus and/or into a radio network. The communications medium 25 can be in the form of a communications bus, for example, a CAN-bus (Controller Area Network), like that which can be provided in an electric vehicle for communication with control devices. Then the communications device 24 can be an SBC (System Basis Chip), for example.

The source datum 22 can be a voltage value of the source voltage Ubat and/or a status datum relating to the energy source 12. Each resistance datum 23 can be, for example, a resistance value of the corresponding isolation resistance Riso+, Riso−, and/or a status datum relating to the electric isolation.

To determine the data 22, 23, the monitoring apparatus 21 can have one measuring circuit 26, 27 for each of the poles 13, 14 and each measuring circuit can be circuited via a circuit breaker 28 to the particular pole 13, 14. The circuit breakers 28 can be connected to the high-voltage circuit 11 at separate connection points 13', 14'. The connection points 13', 14' are each located between one of the poles 13, 14 and the associated safety switch 15. The measuring circuit 26 herein can be circuited with the pole 13 and measuring circuit 27 can be circuited with pole 14. Each circuit breaker 28 can be a mechanical switch, for example, a reed relay. The galvanic separation 20 of the particular measuring circuit 26, 27 with respect to the energy source 12 is possible by means of the particular circuit breaker 28. The circuit breakers 28 can be controlled or switched by the evaluation device 32, for example, by using a separate coupling signal 28'. Thus by opening of the safety switch 15 and the circuit breaker 28, a bias current from the energy source 12 can be reduced.

By means of the measuring circuit 26 the pole 13 (with closed circuit breaker 28) can be electrically coupled to or connected to the reference potential KL31 by means of the voltage divider 29. Accordingly, the measuring circuit 27 can electrically couple or connect the pole 14 (with closed circuit breaker 28) to the reference potential KL31 by means of a voltage divider 30.

The voltage divider 29 can feature two resistance elements R1, R2, which each represent a particular circuit branch of the voltage divider 29. A pick-off point 31 can be provided between the circuit branches, where an evaluation device 32 can be connected. Accordingly, a separate switching branch of the voltage divider 30 can be formed for the voltage divider 30 by each of the two resistance elements R3, R4. A pick-off point 33 can be provided between the circuit branches, by which the evaluation device 32 can be connected to the voltage divider 30.

The evaluation device 32 can feature, for example, an analog-digital converter 34, which can feature two analog inputs 35, each of which can be connected to one of the pick-off points 31, 33 of the voltage divider 29, 30. The evaluation device 32 thus can detect a voltage value Um1, Um2 at the pick-off points 31, 33 of measured voltages decreasing at the pick-off points 31, 33 with respect to the reference potential KL31. The voltage value Um1 here denotes the voltage value picked off at the voltage divider 29, and the voltage value Um2 denotes the voltage value picked off at the voltage divider 30. Then for example, a processor device 36 can determine the source datum 22 based on the voltage values Um1, Um2. This will be explained in greater detail below based on FIG. 2. The processor device 36 can be designed on the basis of a microprocessor or a microcontroller, for example.

In order also to determine the resistance data 23, each measuring circuit 26, 27 can feature a bridging branch 37. The bridging branch 37 can completely bridge the voltage divider 29, 30 of the particular measuring circuit 26, 27 to the reference potential KL31.

The bridging branch 37 of the measuring circuit 26 can feature a resistance element Ra, and the bridging branch 37 of the measuring circuit 27 can feature a resistance element Rb. Furthermore, a switching element 38 can be provided in the particular bridging branch 37, which can be designed, for example, on the basis of a semiconductor switch, in particular a transistor, for example, a MOSFET. Each switching element 38 is different, in particular from the circuit breakers 28. The particular switching element 38 of the bridging branches 37 can be inlet connected or outlet connected to the particular resistance element Ra, Rb. An additional resistance element 39 can be circuited in parallel to each switching element 38 for limiting the electric voltage decreasing across the switching element 38. The additional resistance elements 39 are optional and are used for limiting of the maximum voltage to the switching elements 38. Given a sufficient dielectric strength of the switching elements 38, the additional resistance elements 39 are not called for. In the subsequent discussion of the exemplary form, it is assumed here that the resistance elements 39 are not present.

The switching elements 38 can be switched through the evaluation device 32 by means of a particular switching signal 40, for example. Thus a total of four switching combinations or switching constellations of the monitoring apparatus 21 can be designed. Thus depending on the switching state of the switching element 38 of the particular measuring circuit 26, 27, a different total resistance of the particular measuring circuit 26, 27 can be effectively adjusted between the particular pole 13, 14 on the one hand, and the reference potential KL31 on the other hand. In the case of the bridging branches 37, the particular resistance element Ra, Rb is not active when the switching element 38 is switched electrically blocking. The resistance element Ra, Rb of the particular bridging branch 37 is only active when the switching element 38 is switched electrically conducting. When using a particular, additional resistance element 39, different electric resistance values of the bridging branch 37 are obtained by switching the switching element 38.

By adjusting of three switching constellations a total of three voltage values Um1 (one per each switching constellation) can be picked off or detected at the voltage divider 29, and a total of three voltage values Um2 (one per each switching constellation) can be picked off or detected at the voltage divider 30.

The evaluation device 32, can, for example, determine the overall resistance data 23 by means of the processor device 36 on the basis of an allocation guideline 41 from the total detected voltage values Um1, Um2 of the different switching constellations. This will be explained below in connection with FIG. 2 and FIG. 3 and FIG. 4.

Firstly, the monitoring apparatus 21 will be fully explained. The monitoring apparatus 21 can optionally also determine an intermediate circuit voltage Uzk in the intermediate circuit 17 and/or a charging current Udc at the at least one charger connection 18. The intermediate circuit voltage Uzk represents the potential difference between the potentials Uzk+ and Uzk−. The charging voltage Udc represents the potential difference between the potentials Udc+ and Udc−.

Measurement resistors 42 can be provided by which even measured values 45 in the high-voltage circuit 11 can be detected by means of a measuring circuit 43. By means of a shunt resistor 44, a current strength in the circuit network 16 can also be determined in a known manner. From the high-voltage circuit 11, that is, from its electrical potential, the detected measured values 45 can be transmitted via a voltage decoupling 46, for example, to the evaluation device 32 of the low-voltage circuit 11'. For this purpose the measured values 45 can be digitized, for example, by means of an analog-digital converter. The voltage decoupling 46 can comprise, for example, a DC-DC converter (direct current converter) and/or an ISO coupler. An ISO coupler can be designed by means of a digital coupler and/or an optical-electronic coupling.

Figure 2:
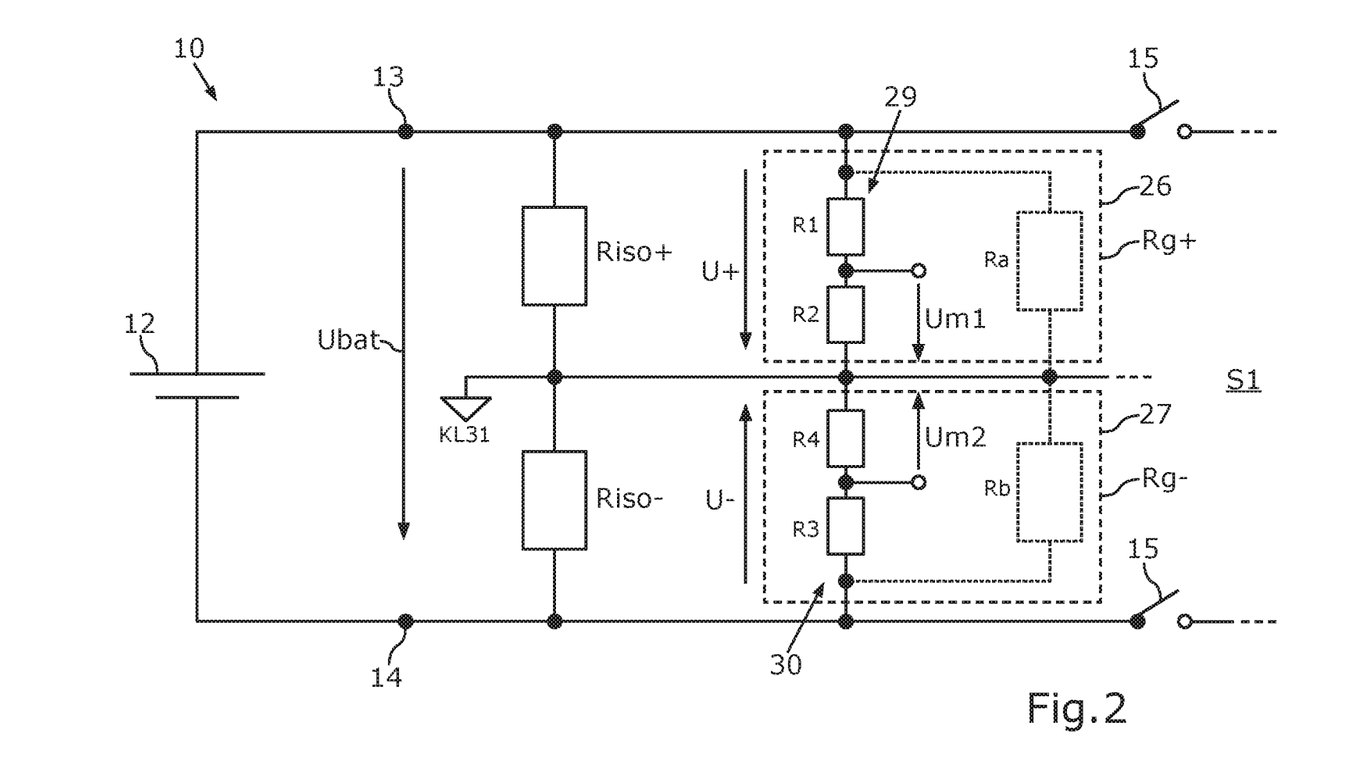
FIG. 2 is a replacement circuit diagram of the high-voltage system for a first switching constellation of measuring circuits of a monitoring system of the high-voltage system according to the present disclosure.
Figure 3:
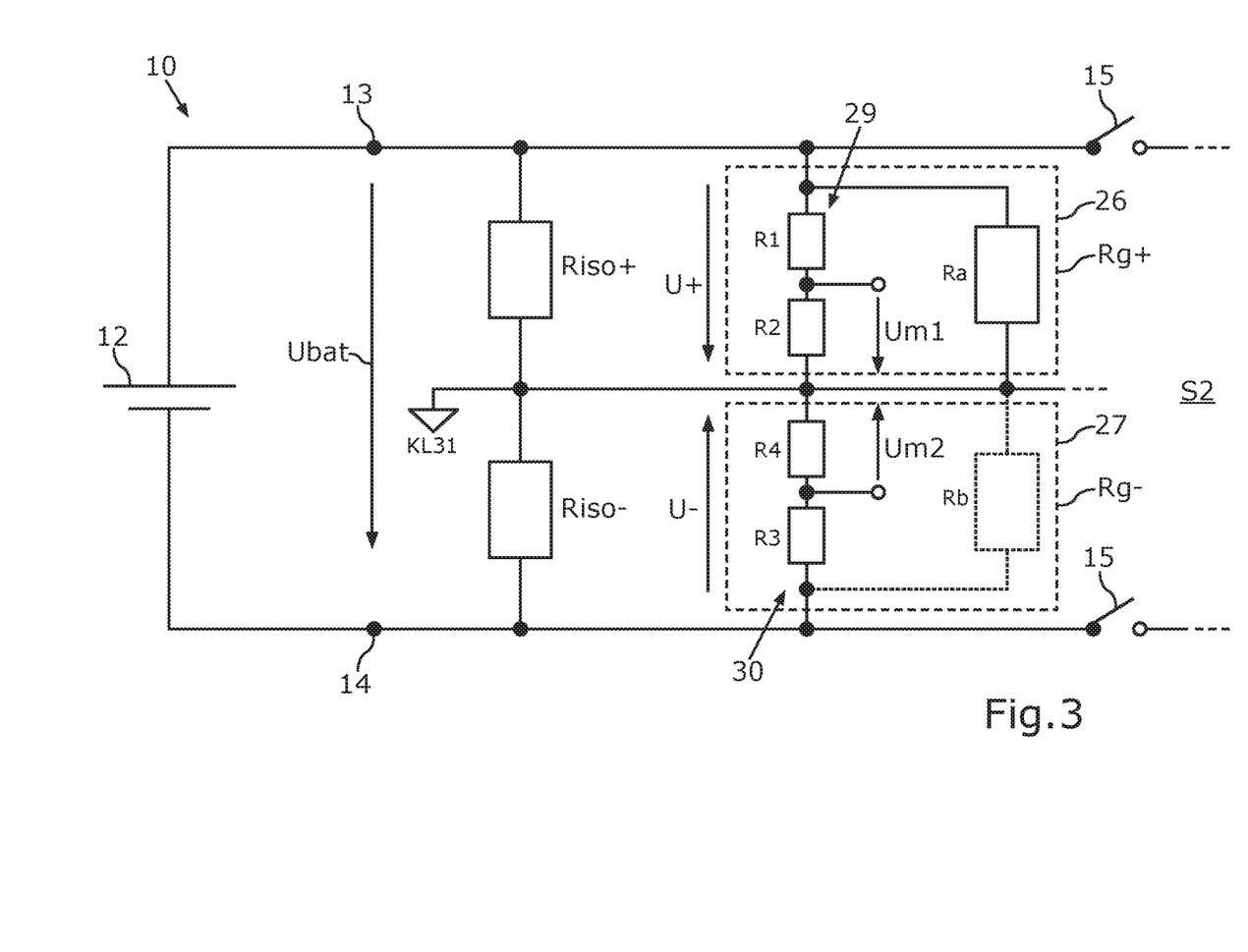
FIG. 3 is a replacement circuit diagram for a second switching constellation according to the present disclosure.
Figure 4:
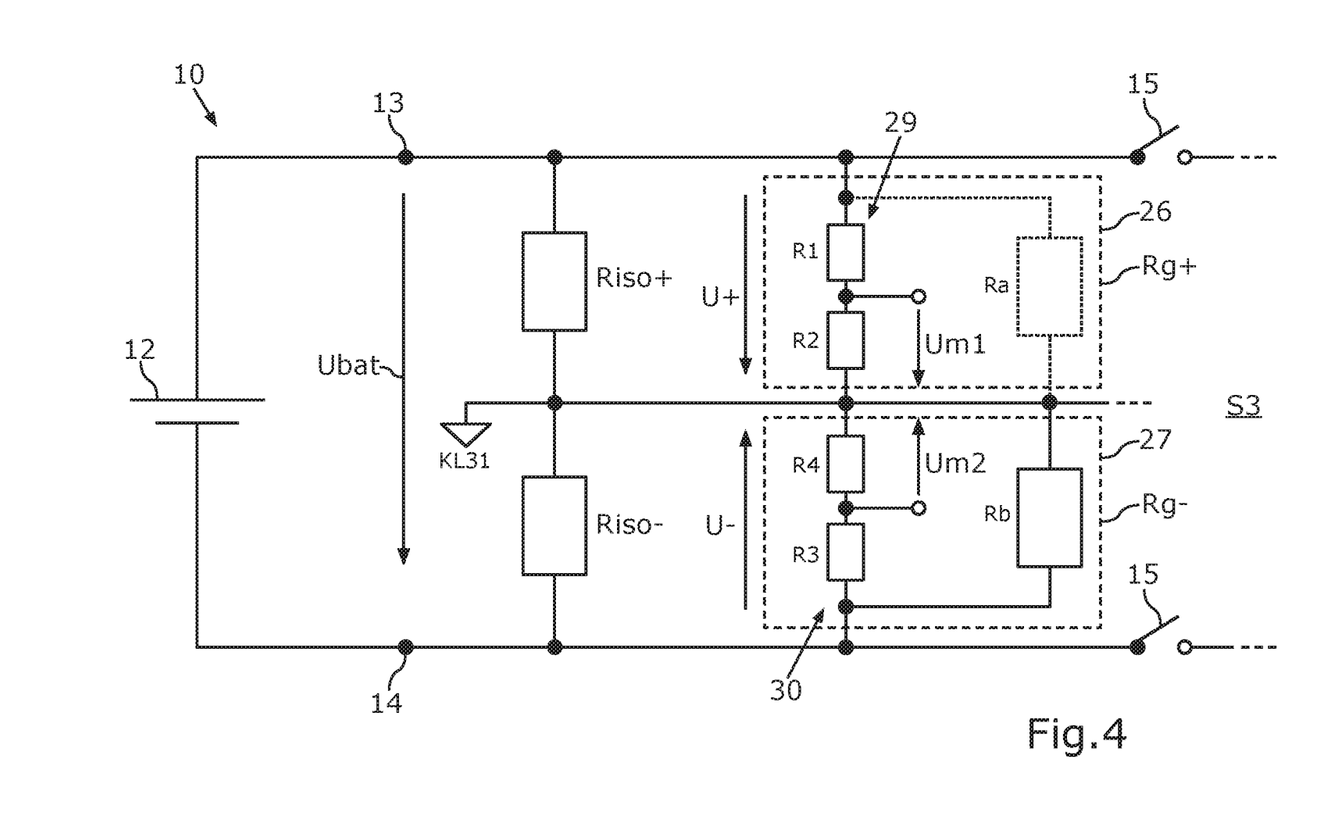
FIG. 4 is a replacement circuit diagram for a third switching constellation according to the present disclosure.

FIG. 2, FIG. 3 and FIG. 4 each illustrate different switching constellations S1, S2, S3 which can be adjusted by switching of the switching elements 38. In this case we are dealing with exemplary switching constellations. The three switching constellations S1, S2, S3 may cause two asymmetrical loads for the energy source 12, that is, the total resistances of the measuring circuits 26, 27 are different for each asymmetrical switching constellation.

In the following discussion it is assumed that the safety switches 15 are opened, that is, they are switched electrically blocking, during the measuring processes for an isolation measurement to be described below. But the isolation measurement can be implemented both for open, and also for closed safety switches 15. With the safety switches 15 closed, the isolation resistances of the overall system of the high-voltage circuit 11 are determined; with the safety switches 15 open, solely the internal isolation resistances of the energy supply 12 are determined (that is for example, the HV-battery). During the measurement processes, the circuit breakers 28 can be permanently switched to electrically conducting, that is, switched to closed.

FIG. 2 illustrates how, in the case of switching constellation S1, both switching elements 38 of the bridging branches 37 are switched as electrically blocking, so that the resistance elements Ra, Rb are not active, if it is assumed that the resistance elements 39 are not present.

Based on the voltage values Um1, Um2 of the voltage dividers 29, 30, conclusions can be drawn about the isolation voltages U+ and U− illustrated in FIG. 2. The isolation voltage U+ is also the electric voltage acting across the isolation resistance Riso+. The isolation voltage U− is also the electric voltage acting across the isolation resistance Riso−. By means of the voltage divider 29 the isolation voltage U+ can be determined from the voltage value Um1. In this regard the known calculation equation for a voltage divider can be used: U+=(R1+R2)/R2·Um1.

A conclusion can be drawn about the voltage U− for voltage divider 30 from the voltage value Um2 by means of the following formula: U−=(R3+R4)/R4·Um2.

Thus for the source voltage Ubat a voltage value can be determined as follows:

$$Ubat = U+ - U-,$$

wherein the subtraction takes place based on the counting direction depicted by the directional arrow in FIG. 2.

Thus from a single switching constellation S1 the source voltage datum 22 can be determined as a voltage value. By a comparison of the voltage value for the source voltage Ubat with at least one predetermined value interval, a datum of state can be determined for the source voltage Ubat and/or the energy source 12. The voltage values Um1, Um2 can also be compared directly with at least one predetermined value range and the datum of state can be determined as a function of the result of the comparison. This reduces the calculation effort.

The numeric ratio of U+ and U− thus depends on the particular electrical resistance which is acting between the particular pole 13, 14 on the one hand, and the reference potential KL31 on the other hand. But in this case the total resistance of the measuring circuits 26, 27 must be taken into account, since the measuring circuit 26 is acting parallel to the isolation resistance Riso+ and the measuring circuit 27 is acting parallel to the isolation resistance Riso−. The particular total resistance on the measuring circuits 26, 27 is denoted in FIG. 2 as Rg+ for measuring circuit 26 and as Rg− for measuring circuit 27. The total resistance Rg+ for switching constellation S1 is defined as: Rg+=R1+R2. For measuring circuit 27 we have: Rg−=R3+R4 for switching constellation S1.

The ratio of the isolation voltages U+ and U− is obtained as:

$$U+/U- = -(Riso+\|Rg+)/(Riso-\|Rg-)$$

wherein the operator $\|$ stands for the inherently known calculation of a parallel circuitry of two ohmic resistors, that is: Rx$\|$Ry=Rx·Ry/(Rx+Ry).

The total resistances Rg+ and Rg− are known for all switching constellations S1, S2, S3. The isolation voltages U+ and U− for each switching constellation S1, S2, S3 can be determined in the described manner from the voltage values Um1, Um2.

Thus from the ratio of U+/U− for each switching constellation an equation is obtained with the two unknown isolation resistances Riso+, Riso−.

FIG. 3 shows another possible switching constellation S2, which in contrast to switching constellation S1, the switching element 38 of the bridging branch 37 of measuring circuit 26 is switched to electrically conducting. Then from this a different value is derived for the total resistance Rg+ of measuring circuit 26. Thus by means of the equation provided above for the ratio U+/U− it is possible to derive a second equation with the two unknown isolation resistances Riso+ and Riso−.

But then we have two equations with two unknowns, so that a resistance value can be calculated for both isolation resistances Riso+ and Riso−.

FIG. 4 shows, for example, that the additional switching constellation S3 can be provided to obtain a redundant or a more accurate measurement. The switching element 38 of measuring circuit 26 is electrically blocking in switching constellation S3 and instead, the switching element 38 of measuring circuit 27 is switched to be electrically conducting. Accordingly, in comparison to switching constellation S1, a different value of the total resistance Rg− is obtained. Then by using the equation stated above for the ratio U+/U− an additional equation can be derived which can be applied with one of the two equations for switching constellations S1 or S2 for an additional calculation of resistance values for the isolation resistances Riso+ and Riso−. The choice of the particular pair of equations for determining of the final resistance datum can be made depending on the outcome of a test calculation of the ratios Riso+/Rg+ and Riso−/Rg− determined with two of the equations. Rg+ should satisfy a predetermined similarity criterion with respect to Riso+, and Rg− should satisfy a predetermined similarity criterion with respect to Riso+. For example, the similarity criterion can state that the particular isolation resistance should be not less than 50%, in particular not less than 30% of the total, parallel acting resistance of the measuring circuit 26, 27.

Figure 5:
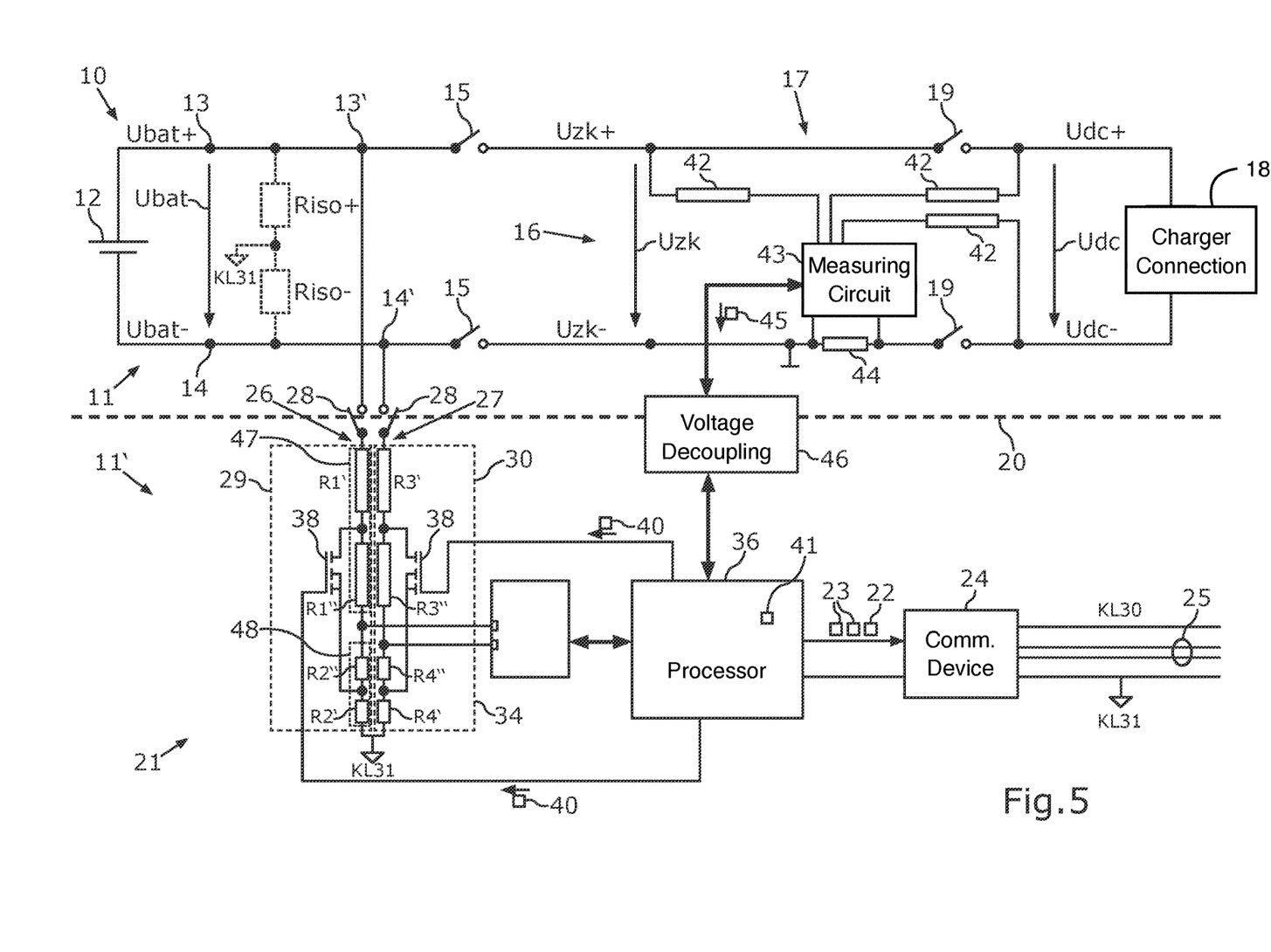
FIG. 5 is a schematic representation of an alternative design of the high-voltage system according to the present disclosure.

FIG. 5 illustrates an alternative form of the monitoring apparatus 21. Only the differences in comparison to FIG. 1 will be described below. The other elements and their function correspond to those as were already described in connection with FIG. 1.

With regard to the measuring circuits 26, 27, instead of a bridging branch 37, the switching element 38 is integrated into each of the particular voltage dividers 29, 30.

Whereas the two circuit branches of the voltage divider 29 in the form according to FIG. 1 are provided for splitting the voltage due to the resistance elements R1 and R2, now in the form according to FIG. 5, circuit branches 47, 48 are provided in the voltage divider 29 which are electrically connected to each other by means of the pick-off point 31. The circuit branch 47 can be divided and thus features two resistance elements R1' and R1". The circuit branch 48 can be divided and thus features two resistance elements R2' and R2". The design can also be such that only one of the two circuit branches 47, 48 is divided. The switching element 38 of the measuring circuit 26 can be designed such that in the electrically conducting state it bridges, at least in part, at least one of the circuit branches 47, 48, that is, it bridges the resistance element R1" and/or R2". FIG. 5 depicts one form in which the resistance elements R1" and R2" of the two circuit branches 47, 48 are electrically bridged. In the electrically blocking state, the circuit branches are not bridged or are fully active. Here again, due to the switching of the switching element 38, a change to the total resistance of the measuring circuit 26 results.

The same happens accordingly also for measuring circuit 27. That is, the circuit branches of the voltage divider 30 of measuring circuit 27 can be divided by provision of resistance elements R3' and R3" in one circuit branch, and R4' and R4" in the other circuit branch. Accordingly, switching element 38 of measuring circuit 27 can partially bridge one or both circuit branches of the voltage divider 30 when it is switched to electrically conducting. Thus by switching of the switching element 38, the total resistance of the measuring circuit 27 will be changed or switched.

Thus, with the form according to FIG. 5 it is also possible that two or three switching constellations can be adjusted such that changed total resistances Rg+ and Rg− of the measuring circuits 26, 27 will result. Accordingly, with the equations stated above and on the basis of the form according to FIG. 5, both the source voltage datum 22 as well as the resistance data 23 can be determined.

The two presented solution variants thus allow a combination of a high voltage measurement of source voltage with a measurement of the isolation voltage with only two measuring circuits 26, 27. For galvanic separation 20 between the high-voltage circuit 11 and the low-voltage circuit 11', and also to observe the requirements for bias current for the energy source 12, only two circuit breakers 28 are then used, for example, each one being a reed relay. Also, the charging of the circuit network 16 in the switched off state (safety switch 15 open) is not possible, since the high-voltage side of the measuring circuit 43 is not connected to the poles 13, 14 of the energy source 12, which would lead to an additional electrical bridging of the safety switch 15 for a measurement.

The two variants according to FIG. 1 and FIG. 5 differ in the design of the load circuit of the energy source 12 required for the isolation measurement, that is, they differ in the design of the setting of the total resistances Rg+ and Rg−.

The proposed variant according to FIG. 5 affords the additional advantage in this case that solely two connections instead of four connections are provided to the reference potential KL13. The two voltage dividers 29, 30 are themselves designed as being switchable through the use of switching elements 38, in order to enable the asymmetrical load on the energy source 12 which is desired for the isolation measurement (measurement of isolation resistances Riso+, Riso−).

The advantages of the monitoring apparatus 21 are that the requirement for bias current for the energy source 12 can be satisfied, that is, the bias current can be reduced. Here, only two breaker switches 38, for example, two reed relays, for complete switch-off or for galvanic separation 20. No high-ohm bridging of the safety switch 15 out to the measuring circuit 43 can occur. By dispensing with the bridging branches 37 the number of high-voltage resistant connections to the reference potential KL31 can be reduced (see FIG. 5). The described isolation measurement cannot be affected due to external isolation faults. Due to the combination of mechanical circuit breakers 28, in particular relays, and the switching elements 38 in the form of semiconductor switches, firstly a true galvanic separation 20 of the measuring circuits 26, 27 from the energy source 12 (circuit breaker 28) and also secondly a limiting of the switching cycles of the switching elements 38 can be attained.

Therefore, the ability to maintain the bias current conditions after shutoff or disconnecting of the high voltage measurement of source voltage, as well as the conditions for galvanic disconnection of the isolation measurement from the high voltage circuit, and also the conditions for a cyclical measurement of source voltage and of isolation resistance have been met. A combination of a switchable isolation measuring circuit with the high voltage measurement of source voltage is obtained. In addition, due to the combination of mechanical circuit breaker (reed relay) and switching element 38 as semiconductor switch, a high isolation voltage and also a galvanic disconnect are possible, without limiting of the possible switching cycles for adjusting of the switching constellations. The switching elements 38 need not be switched or actuated for adjusting of the switching constellations.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean "at least one of A, at least one of B, and at least one of C."

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A monitoring apparatus configured to monitor a source voltage generated by an electrical energy source and between two electrical poles, the monitoring apparatus configured to monitor two isolation resistances of the electrical energy source, wherein each of the two isolation resistance is provided between one of the two electrical poles and a reference potential, the monitoring apparatus comprising:
   two measuring circuits, wherein each measuring circuit is associated with one of the two electrical poles, wherein each measuring circuit includes only one a voltage divider that connects each electrical pole to the reference potential and configured to monitor a source voltage datum of the source voltage and the two isolation resistances; and
   an evaluation device connected to the two measuring circuits, wherein the evaluation device detects a voltage value at each voltage divider of each of the two measuring circuits, wherein the evaluation device is configured to determine the source voltage datum based on the detected voltage value,
   wherein for at least one of the two measuring circuits, a total electrical resistance is based on a switch state of a switching element of the at least one of the two measuring circuits, and
   the evaluation device, by switching of a switching element, adjusts at least two predetermined, different switching constellations of the two measuring circuits, and based on the detected voltage value of the voltage divider for each of the switching constellations, the evaluation device determines a particular resistance datum for each of the two isolation resistances based on a predetermined allocation guideline.

2. The monitoring apparatus according to claim 1, wherein each measuring circuit includes a switching element, and the evaluation device, via the switching element, adjusts at least three predetermined, different switching constellations and based on the detected voltage value of the voltage divider for each of the at least three predetermined, different switching constellations, determines a resistance datum for each isolation resistance based on the predetermined allocation guideline.

3. The monitoring apparatus according to claim 1, wherein the switching element comprises at least one semiconductor switch.

4. The monitoring apparatus according to claim 1, wherein each measuring circuit includes at least one mechanical circuit breaker to connect the measuring circuit to one of the two electrical poles, and depending on a coupling signal from the evaluation device, to switch between an electrically connected state and an electrically disconnected state.

5. The monitoring apparatus according to claim 4, wherein the at least one mechanical circuit breaker includes a reed relay.

6. The monitoring apparatus according to claim 4, wherein the evaluation device is configured to keep the at least one mechanical circuit breaker in the electrically connected state for the adjusted switching constellations by the coupling signal.

7. The monitoring apparatus according to claim 1, wherein the predetermined allocation guideline is based on a calculation guideline which creates a relationship between the detected voltage values at the voltage dividers and the isolation resistance.

8. The monitoring apparatus according to claim 1, wherein for one or both of the two measuring circuits, one bridging branch is circuited in parallel with the voltage divider, the bridging branch including an electrical resistance element, and the switching element of the measuring circuit is inlet connected or outlet connected to the electrical resistance element.

9. The monitoring apparatus according to claim 8, wherein an additional resistance element is circuited in parallel to the switching element in the bridging branch.

10. The monitoring apparatus according to claim 1, wherein the voltage divider for one or for both of the two measuring circuits is formed from two circuit branches connected via a pick-off point for detecting the voltage value, and wherein the switching element, in an electrically connected state, at least partly electrically bridges at least one of the two circuit branches.

11. The monitoring apparatus according to claim 1, wherein the evaluation device is coupled galvanically to the reference potential.

12. A high-voltage system comprising:
   an electrical energy source which generates a source voltage between two electrical poles, and a circuit network, wherein each electrical pole of the electrical energy source is connected to the circuit network, via a safety switch with galvanic disconnect switching;
   a connection point between each electrical pole and an associated safety switch; and
   a monitoring apparatus according to claim 1, wherein each measuring circuit of the monitoring apparatus is connected to one of the connection points.

13. The high-voltage system according to claim 12, wherein the electrical energy source comprises a high-voltage battery and/or a fuel cell stack.

14. The high-voltage system according to claim 12, wherein the source voltage is a direct voltage and a voltage value of the source voltage is greater than 60 V and less than 1500 V.

15. A method for monitoring a source voltage generated by an electrical energy source comprising:
   connecting each of two poles of the electrical energy source, via a voltage divider of a measuring circuit of each pole, to a reference potential, wherein each of the measuring circuits includes only one voltage divider that connects each of the two poles to the reference potential;
   detecting, by an evaluation device connected to each measuring circuit, a voltage value at the only voltage divider of each measuring circuit; and
   determining, by the evaluation device, a source voltage datum of the source voltage based on the detected voltage value;
   adjusting, by a switching element of the measuring circuit, a total electrical resistance of the measuring circuit of at least one of the two poles;
   adjusting, by the switching element of measuring circuit, at least two predetermined, different switching constellations; and
   determining, by the evaluation device, a resistance datum for two isolation resistances of the electrical energy source based on a predetermined allocation guideline and a detected voltage value for each switching constellation.

* * * * *